(12) United States Patent
Meiser et al.

(10) Patent No.: US 8,860,136 B2
(45) Date of Patent: Oct. 14, 2014

(54) SEMICONDUCTOR DEVICE AND METHOD OF MANUFACTURING A SEMICONDUCTOR DEVICE

(71) Applicant: Infineon Technologies AG, Neubiberg (DE)

(72) Inventors: Andreas Meiser, Sauerlach (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/692,397

(22) Filed: Dec. 3, 2012

(65) Prior Publication Data
US 2014/0151758 A1    Jun. 5, 2014

(51) Int. Cl.
*H01L 27/06* (2006.01)
*H01L 29/78* (2006.01)
*H01L 29/66* (2006.01)

(52) U.S. Cl.
CPC .......... *H01L 29/78* (2013.01); *H01L 29/66666* (2013.01)
USPC ......................................... 257/343; 257/345

(58) Field of Classification Search
USPC ................................................ 257/343, 345
See application file for complete search history.

(56) References Cited

U.S. PATENT DOCUMENTS

| | | | |
|---|---|---|---|
| 6,589,845 B1 * | 7/2003 | Nair et al. | 438/268 |
| 6,835,993 B2 * | 12/2004 | Sridevan et al. | 257/492 |
| 7,126,166 B2 * | 10/2006 | Nair et al. | 257/110 |
| 7,132,333 B2 | 11/2006 | Schloesser et al. | |
| RE40,352 E * | 6/2008 | Deboy et al. | 257/341 |
| 7,595,242 B2 * | 9/2009 | Nakazawa et al. | 438/269 |
| 7,622,354 B2 * | 11/2009 | Dreeskornfeld et al. | 438/272 |
| 7,635,893 B2 | 12/2009 | Weis et al. | |
| 7,714,384 B2 * | 5/2010 | Seliskar | 257/331 |
| 7,838,444 B2 * | 11/2010 | Oguri | 438/792 |
| 2011/0127606 A1 * | 6/2011 | Bobde et al. | 257/337 |

* cited by examiner

*Primary Examiner* — Matthew W Such
*Assistant Examiner* — Stephen C Smith
(74) *Attorney, Agent, or Firm* — Murphy, Bilak & Homiller, PLLC

(57) ABSTRACT

A semiconductor device includes a transistor, formed in a semiconductor substrate having a first main surface. The transistor includes a source region, a drain region, a channel region, a drift zone, and a gate electrode being adjacent to the channel region, the gate electrode configured to control a conductivity of a channel formed in the channel region. The channel region and the drift zone are disposed along a first direction between the source region and the drain region, the first direction being parallel to the first main surface. The channel region has a shape of a ridge extending along the first direction and the drift zone including a superjunction layer stack.

20 Claims, 11 Drawing Sheets

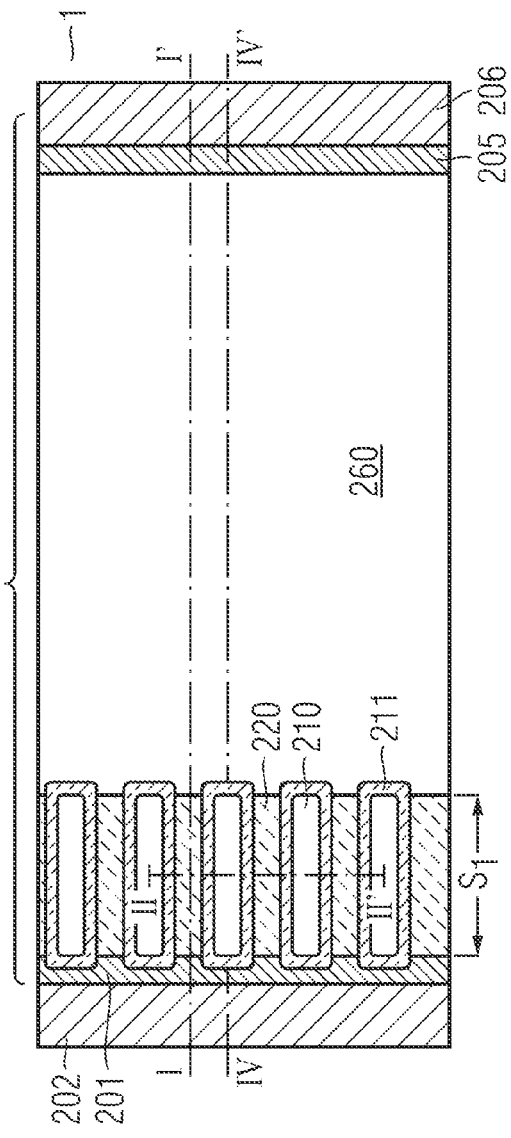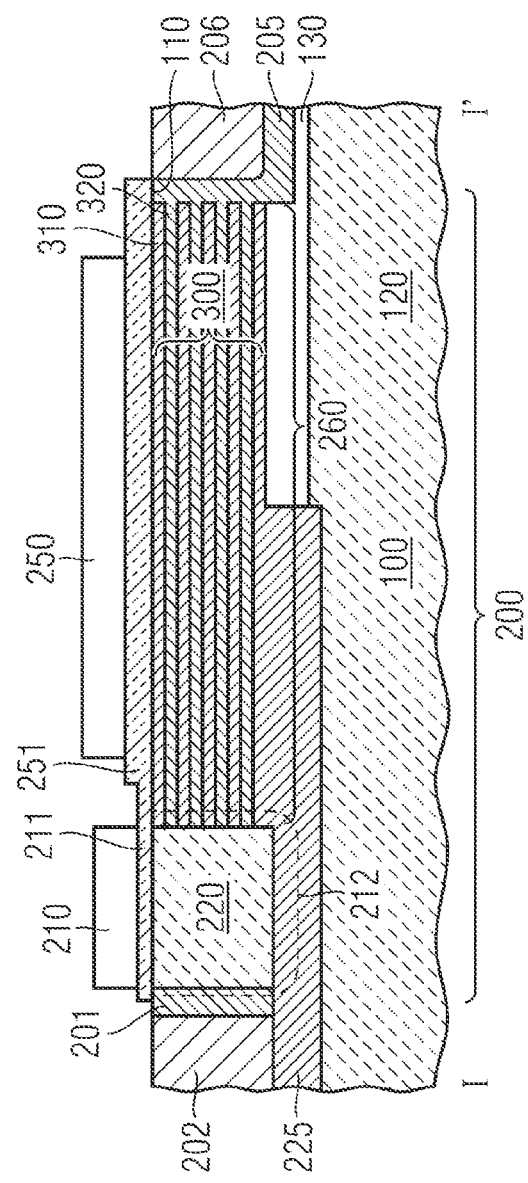
FIG. 1B
FIG. 1A

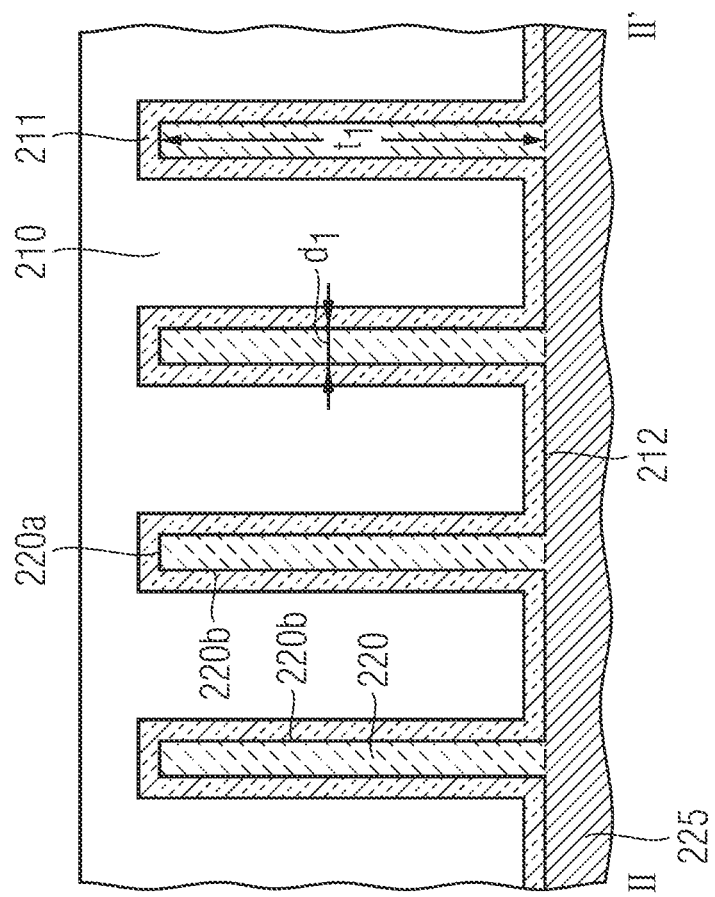

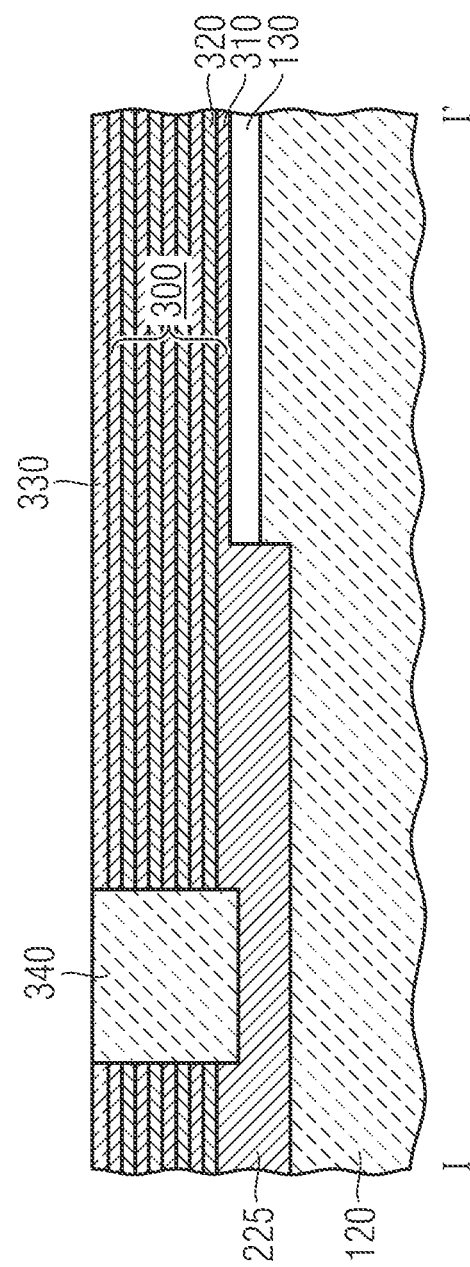

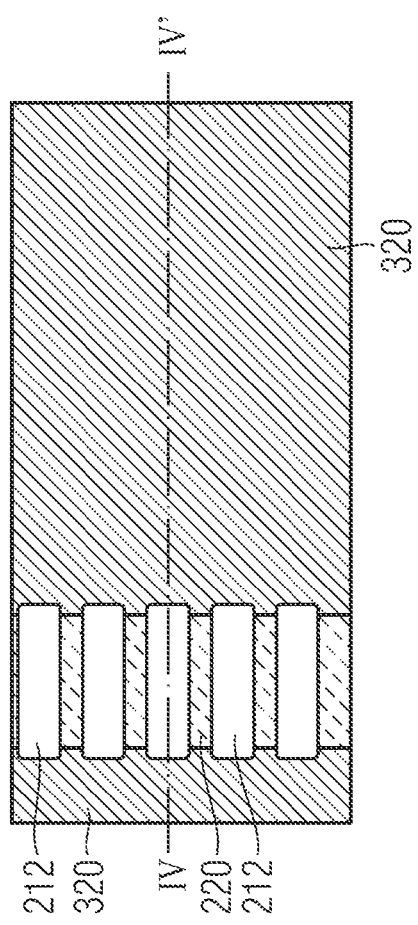
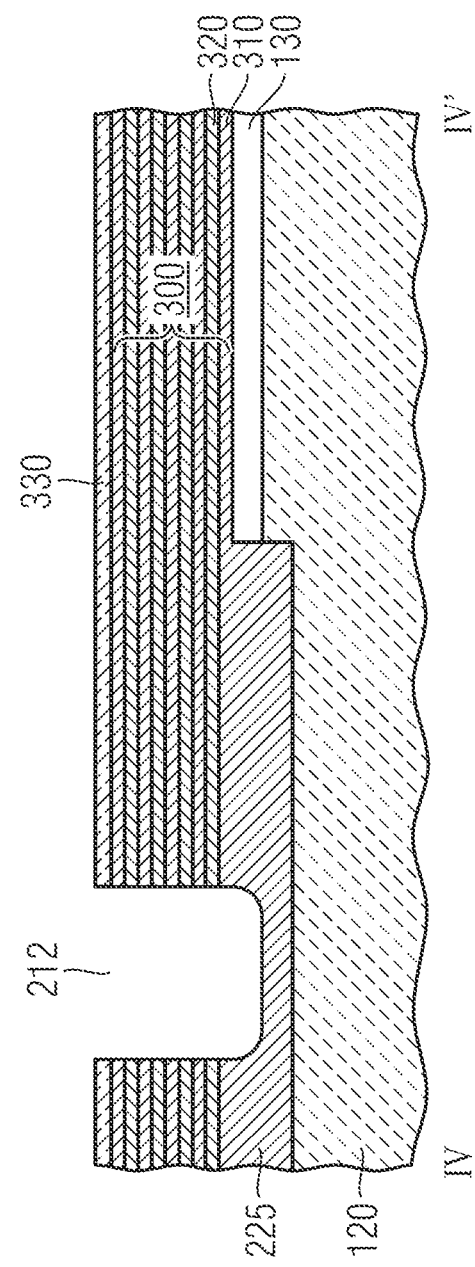

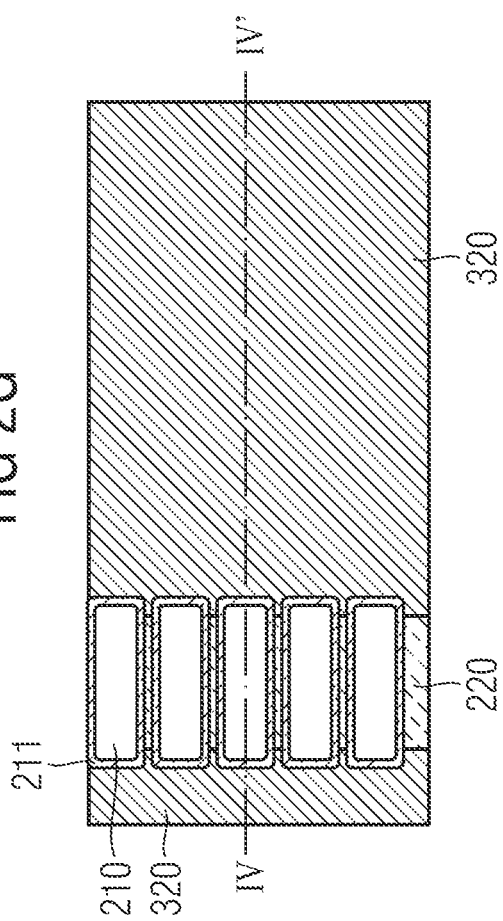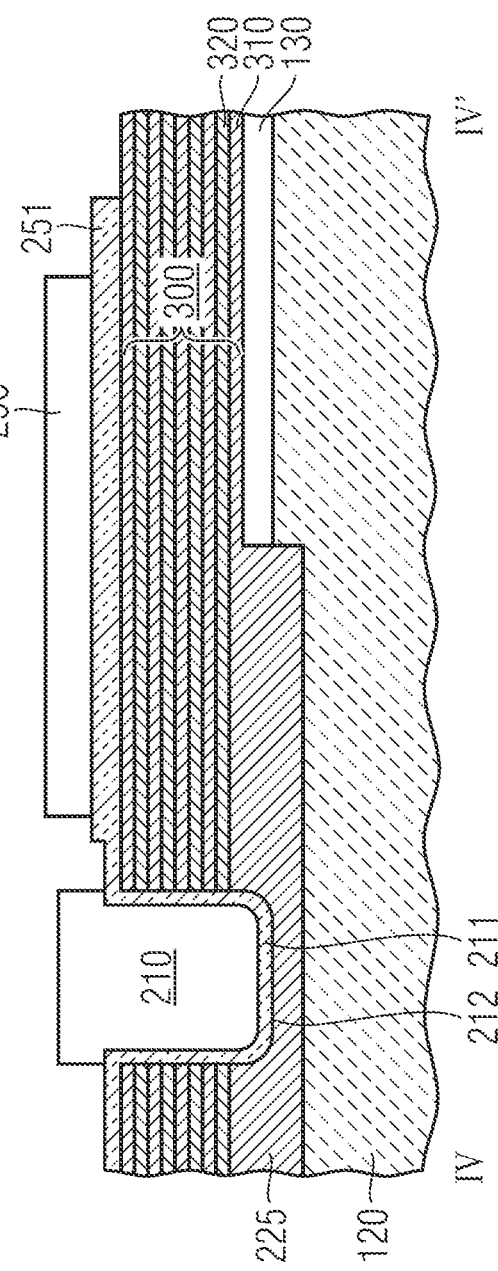

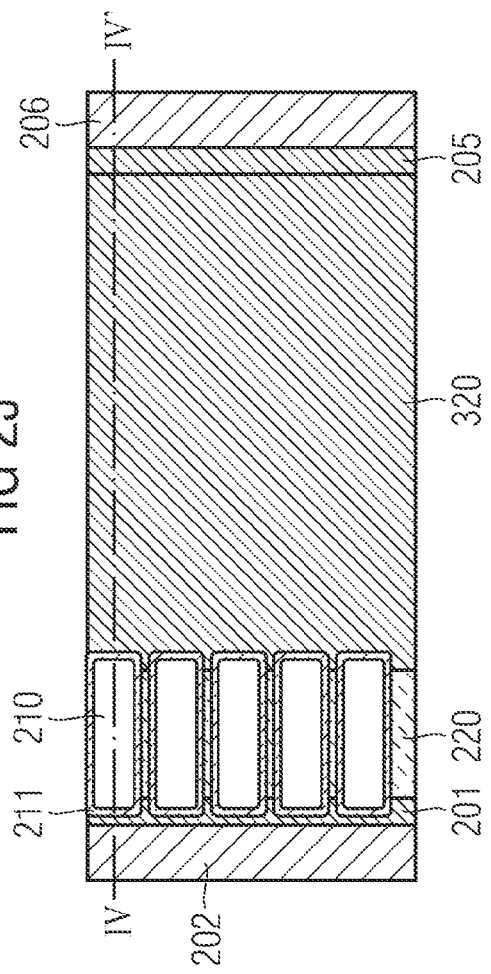
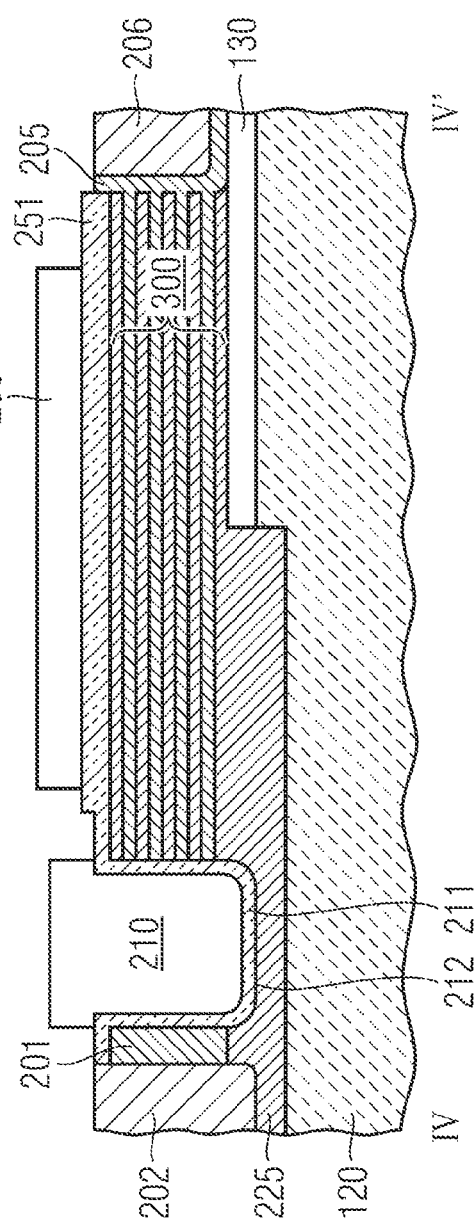
FIG 2J
FIG 2H

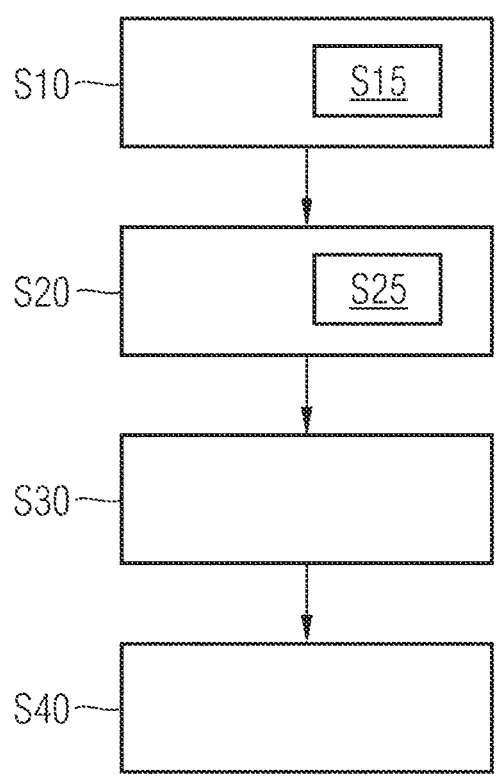

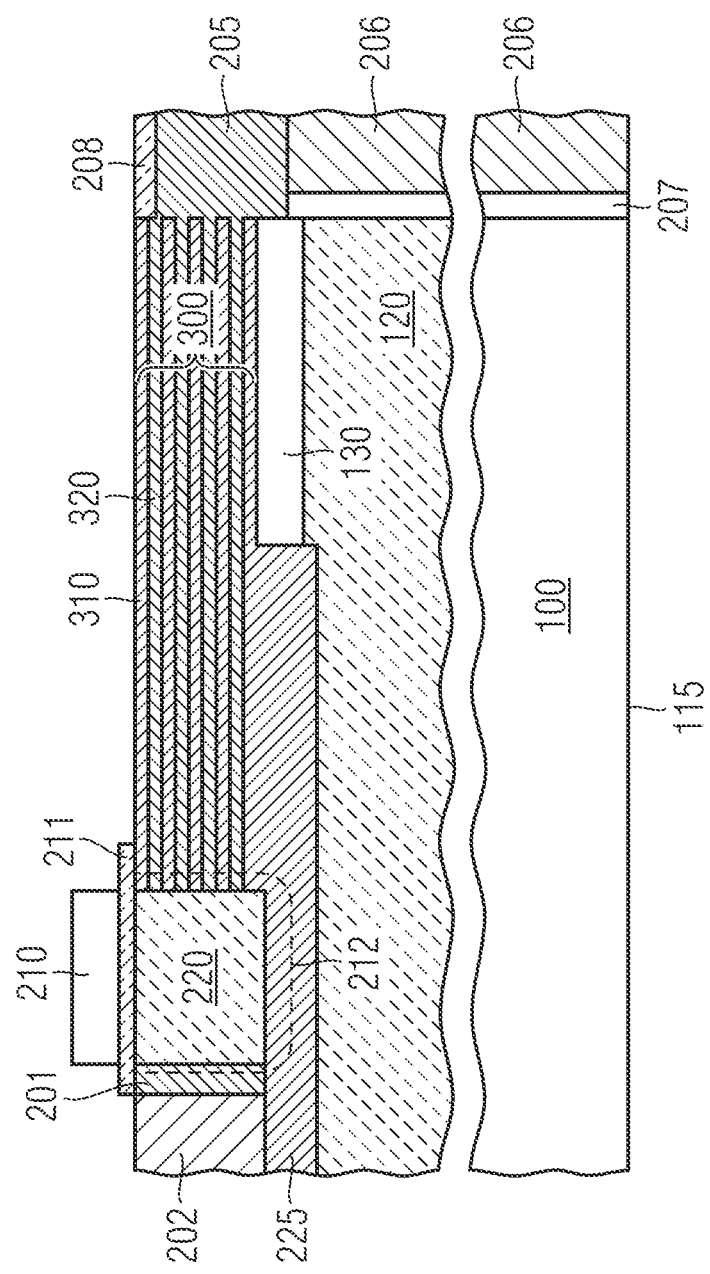

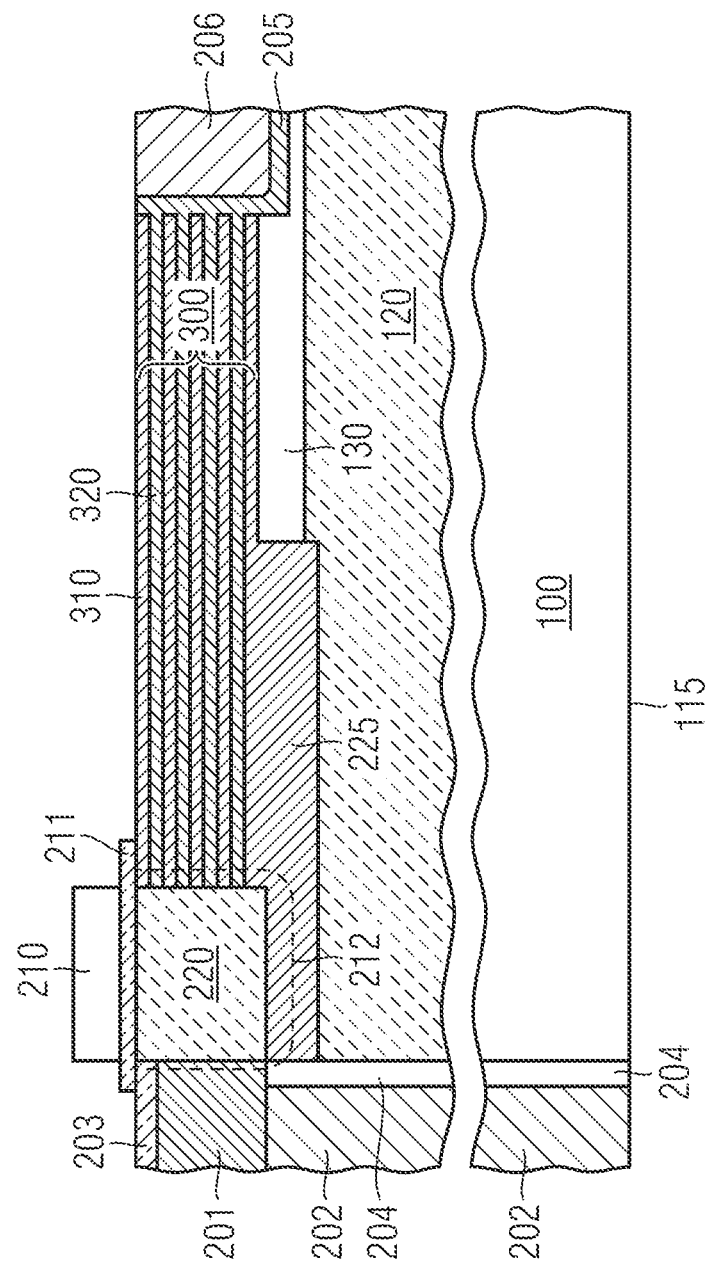

SEMICONDUCTOR DEVICE AND METHOD OF MANUFACTURING A SEMICONDUCTOR DEVICE

TECHNICAL FIELD

The present specification relates to a semiconductor device and a method of manufacturing a semiconductor device.

BACKGROUND

MOS power transistors or DMOS power devices which are commonly employed in automotive and industrial electronics, should have a low switch-on resistance ($R_{on}$), when being switched on. In a switch-off state, they should have a high breakdown voltage characteristic and withstand high source-drain voltages. For example, a MOS power transistor should withstand a drain to source voltage $V_{ds}$ of some tens to some hundreds volts when being switched off. As a further example, MOS power transistors conduct a very large current which may be up to some hundreds of amperes at a gate-source voltage of about 2 to 20 V at a low voltage drop $V_{ds}$.

According to commonly employed technologies, lateral MOS transistors are used, which comprise a drain extension region or which are based on the so-called resurf concept. According to the resurf concept, in an off-state charges are removed by a doped portion which is disposed beneath the drift region. Alternatively, this doped portion may be implemented as an electrode disposed over the drift region and being insulated from the drift region. In order to further reduce the $Rds_{on}$ and the parasitic capacitances, new concepts for implementing a transistor are being searched for.

SUMMARY

According to an embodiment, a semiconductor device comprises a transistor formed in a semiconductor substrate having a first main surface. The transistor includes a source region, a drain region, a channel region, a drift zone, and a gate electrode adjacent to the channel region, the gate electrode configured to control a conductivity of a channel formed in the channel region. The channel region and the drift zone are disposed along a first direction between the source region and the drain region, the first direction being parallel to the first main surface, and the channel region has a shape of a ridge extending along the first direction. The drift zone comprises a superjunction layer stack.

According to an embodiment, a method of manufacturing a semiconductor device comprises forming a transistor in a semiconductor substrate having a first main surface. Forming the transistor comprises forming a source region, a drain region, a channel region, a drift zone, and a gate electrode adjacent to the channel region, wherein the channel region and the drift zone are formed to be disposed along a first direction between the source region and the drain region, the first direction being parallel to the first main surface. Forming the channel region comprises forming a ridge extending along the first direction, and forming the drift zone comprises forming a superjunction layer stack.

According to a further embodiment, a semiconductor device comprises a transistor formed in a semiconductor substrate having a first main surface. The transistor comprises a source region, a drain region, a channel region, a drift zone, and a gate electrode adjacent to the channel region, the gate electrode configured to control a conductivity of a channel formed in the channel region. The channel region and the drift zone are disposed along a first direction between the source region and the drain region, the first direction being parallel to the first main surface. The drift zone comprises a superjunction layer stack, the superjunction layer stack comprising n-doped and p-doped layers stacked in a stack direction in an alternating manner, the stack direction being perpendicular with respect to the first main surface. At least one of the source region and the drain region extend to a depth so that a bottom boundary between the source region or the drain region and the semiconductor substrate is disposed beneath a bottom interface between the n-doped and p-doped layers of the layer stack.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1A shows a cross-sectional view of an example of a semiconductor device according to an embodiment;

FIG. 1B shows a cross-sectional view of the semiconductor device shown in FIG. 1A, taken parallel to a first main surface of a semiconductor substrate;

FIG. 1C shows a cross-sectional view of the semiconductor device according to an embodiment, taken along a direction perpendicular to the direction along which the cross-sectional view of FIG. 1A is taken;

FIGS. 2A to 2J show cross-sectional views of a semiconductor substrate while performing processing methods of a manufacturing method;

FIG. 3 schematically shows a flow diagram illustrating steps for manufacturing a semiconductor device according to an embodiment; and FIGS. 4A and 4B show cross-sectional views of a semiconductor device according to a further embodiment.

DETAILED DESCRIPTION

Figure 2A:
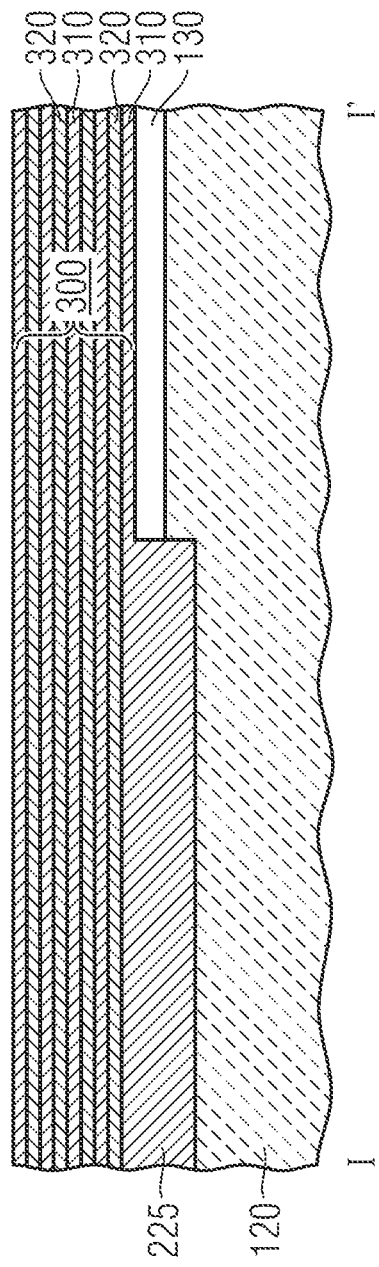

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIG. 1A shows a cross-sectional view of the semiconductor device according to an embodiment, and FIG. 1B shows a different cross-sectional view of the semiconductor device shown in FIG. 1A. The cross-sectional view of FIG. 1A is taken between I and I' shown in FIG. 1B. The direction between I and I' corresponds to the first direction as used within the present specification. The cross-sectional view of FIG. 1B is taken parallel to a first main surface 110, shortly beneath the first main surface 110, so as to divide sublayer 310.

The semiconductor device shown in FIG. 1A comprises a source region 201, a drain region 205, a channel region 220, and a drift zone 260. The source region 201 and the drain region 205 may be doped with dopants of a first conductivity type, for example n-type dopants. The channel region 220 is arranged between the source region 201 and the drift zone 260. The channel region 220 is doped with a dopant of a second conductivity type, for example, p-doped. The drift zone 260 may be arranged between the channel region 220 and the drain region 205. The source region 201, the channel region 220, the drift zone 260 and the drain region 205 are disposed along the first direction.

The source region 201 is connected to the source electrode 202. The drain region 205 is connected to the drain electrode 206.

FIG. 1B shows a cross-sectional view of the semiconductor device taken along a plane parallel to the first main surface 110 of the semiconductor substrate 100. As is shown, the channel region 220 is sub-divided by the gate electrode 210.

The arrangement shown in FIGS. 1A and 1B implements a semiconductor device 1 comprising a transistor 200 that is formed in a semiconductor substrate 100 comprising a first main surface 110. The transistor 200 is implemented as a so-called FinFET in which the channel region 220 has the shape of a ridge extending along the first direction. The transistor 200 further comprises a drift zone 260 including a superjunction layer stack 300. The superjunction layer stack 300 comprises a sequence of doped single-crystalline semiconductor sublayers 310, 320 having reverse polarity. For example, a p-doped sublayer 310 may be followed by an n-doped sublayer 320 and vice versa. For example, the superjunction layer stack 300 may comprise at least two p-doped sublayers 310 or at least two n-doped sublayers 320. The doping concentration of the source and drain region 201, 205 may be higher than a doping concentration of the sublayers 320 constituting the drift zone 260.

In so-called compensation devices comprising a superjunction layer stack, in case an off-voltage is applied to the transistors, a current flow can be effectively blocked since charge carriers of adjacent sublayers, each having a different doping type, compensate each other. As a consequence, adjacent p and n doped regions are caused to fully deplete in an off-state. Accordingly, for achieving similar breakdown characteristics as a conventional device, the doping concentration of the doped layers may be increased, resulting in a reduced resistivity in an on-state. In a superjunction layer stack, the thickness of each of the sublayers may be selected so that in a case of an off-voltage, the sublayers may be fully depleted.

According to an embodiment, the sublayers 310, 320 extend in the first direction. For example, the sublayers 310, 320 may be stacked in a stack direction which is perpendicular to the first main surface 110. Alternatively, the sublayers 310, 320 may be stacked in a stack direction which is parallel to the first main surface 110. For example, the superjunction layer stack 300 may have a thickness of at least 1 μm.

As is indicated by dotted lines in FIG. 1A, in a plane before and behind the depicted plane of the drawing, gate trenches 212 are disposed adjacent to the channel region 220. The gate trenches 212 extend from the first main surface 110 in a depth direction of the substrate 100. As a consequence, the channel region 220 has the shape of a ridge. Further, the gate electrode 210 may be disposed adjacent to sidewalls 220b of the ridge and adjacent to the top side 220a of the ridge. The gate electrode 210 is insulated from the channel region 220 by means of an insulating gate dielectric material 211 such as silicon oxide. When a suitable voltage is applied to the gate electrode 210, the conductivity of a channel that is formed in the channel region 220 will be controlled by the gate voltage. By controlling the conductivity of a channel formed in the channel region 220, the current flow from the source region 201 via the channel formed in the channel region 220 and the drift zone 260 to the drain region 205 may be controlled. When a voltage corresponding to an off-state is applied to the gate electrode 210, no conductive channel is formed at the boundary between the channel region 220 and the insulating gate dielectric material 211 so that no current flows. Further, the sub-layers of the superjunction layer stack 300 are fully depleted so that a current flow is prevented and the device has a high voltage blocking characteristics.

As is further shown in FIG. 1A, the semiconductor device may further comprise a field plate 250 which is arranged adjacent to the drift zone 260. The field plate 250 is insulated from the drift zone 260 by means of an insulating field dielectric layer 251 such as a field oxide. The field plate 250 may be insulated from the gate electrode 210. Instead of the field plate, a terminal sub-layer having an appropriate layer thickness may be disposed on top of the superjunction layer stack 300. The thickness of the terminal sub-layer may be selected so that an appropriate compensation of charge carriers takes place. For example, this terminal sub-layer may have a thickness that is about half the thickness of the other layers of the superjunction layer stack 300.

As is specifically illustrated in FIG. 1A, the source region 201 extends from the main surface 110 into a depth direction of the substrate 100, i.e. perpendicularly with respect to the main surface 110. The channel region 220 and the drift zone 260 are disposed along a first direction which is parallel to the first main surface 110 between the source region 201 and the drain region 205. The drain region 205 likewise extends from the first main surface 110 in a depth direction of the substrate 100.

FIG. 1A further shows a body connect implantation region 225 that is disposed beneath the body region 220 and beneath a part of the drift zone 260. The body connect implantation region 225 connects the channel region 220 to the source contact so as to suppress parasitic bipolar effects which may be caused due to impact ionization when the transistor 200 is set to an off-state. Moreover, the body connect implantation region 225 extends beneath the drift zone 260 so that in an off-state of the transistor 200, the drift zone 260 may be depleted more easily.

FIG. 1C illustrates a cross-sectional view of the substrate 100 which is taken between II and II' in FIG. 1B. The direction between II and II' is perpendicular to the first direction. As is shown in FIG. 1C, the channel region 220 has the shape of a ridge, the ridge having a width $d_1$ and a depth or height $t_1$. For example, the ridge may have a top side 220a and two sidewalls 220b. The sidewalls 220b may extend perpendicularly or at an angle of more than 75° with respect to the first main surface 110. The gate electrode 210 may be disposed adjacent to at least two sides of the ridge.

Beneath each of the ridges, the deep body connect implant region 225 is disposed. A gate dielectric layer 211 is disposed between the gate electrode 210 and the channel region 220.

According to an embodiment, the width $d_1$ of the channel region 220 is: $d_1 \leq 2 \times l_d$, wherein $l_d$ denotes a length of a depletion zone which is formed at the interface between the gate electrode 210 and the channel region 220. For example, the width of the depletion zone may be determined as:

$$l_d = \sqrt{\frac{4\varepsilon_s kT\ln(N_A/n_i)}{q^2 N_A}}$$

wherein $\varepsilon_s$ denotes the permittivity of the semiconductor material ($11.9 * \varepsilon_0$ for silicon), k denotes the Boltzmann constant ($1.38066 * 10^{-23}$ J/K), T denotes the temperature, ln denotes the natural logarithm, $N_A$ denotes the impurity concentration of the semiconductor body, $n_i$ denotes the intrinsic carrier concentration ($1.45 * 10^{10}$ for silicon at 27° C.), q denotes the elementary charge ($1.6 * 10^{-19}$ C).

Generally, it is assumed in a transistor that the length of the depletion zone at a gate voltage corresponding to the threshold voltage corresponds to the maximum width of the depletion zone. For example, the width of the trenches may be approximately 20-130 nm, for example, 40-120 nm along the first main surface 110 of the semiconductor substrate 100.

Moreover, the ratio of length to width may fulfill the following relationship: $s_1/d_1 > 2.0$. According to further embodiments, $s_1/d_1 > 2.5$, wherein $s_1$ denotes the length of the ridge measured along the first direction, as is also illustrated in FIG. 1B.

According to the embodiment in which the width $d_1 \leq 2 \times l_d$, the transistor 200 is a so-called "fully depleted" transistor in which the channel region 220 is fully depleted when the gate electrode 210 is set to an on-potential. In such a transistor, an optimal sub-threshold voltage can be achieved and short channel effects may be efficiently suppressed, resulting in improved device characteristics.

As has further been discussed with reference to FIG. 1A, the source and the drain region 201, 205 extend in the depth direction of the substrate 100. Accordingly, by appropriately setting the depth of the source and drain region, 201, 205, the electric properties of the transistors 200 may be set in accordance with the requirements. Due to the special additional feature that the gate electrode 210 extends in the depth direction adjacent to the channel region 220, it is possible to control the conductivity of a channel that is formed in the channel region 220 by means of the gate electrode 210 along the full depth $t_1$ of the channel region 220. Therefore, the depth of the source region 201 and the drain region 205 determine the effective width of the transistor 200. By setting the depth of the source and the drain regions 201, 205, the width and, consequently, the characteristics of the device may be determined. For example, the depth of the source and the drain regions 201, 205 may be larger than 1 µm. Generally, when being operated in an on-state, a conductive inversion layer is formed in the channel region 220 adjacent to the gate dielectric layer. According to an embodiment, the inversion layer extends along at least one of the two sidewalls 220b and a current flows mostly parallel to the first main surface 110. As is illustrated in FIG. 1C, the gate electrode may be disposed at at least two sides of the ridge. According to a further embodiment, the gate electrode 210 may be disposed along the two vertical sides of the ridge, whereas no gate electrode 210 is disposed adjacent to the horizontal portion of the ridge. According to a further embodiment, the gate trenches 212 may be filled with insulating material only.

The semiconductor device shown in FIG. 1 may further comprise contacts which extend to the first main surface 110 of the semiconductor substrate 100.

According to a further embodiment, a semiconductor device comprises a transistor 200, being formed in a semiconductor substrate 100 comprising a first main surface 110, the transistor 200 comprising a source region 201, a drain region 205, a channel region 220, a drift zone 260, and a gate electrode 210 being adjacent to the channel region 220, the gate electrode 210 being configured to control a conductivity of a channel formed in the channel region 220. The channel region 220 and the drift zone 260 are disposed along a first direction between the source region 201 and the drain region 205, the first direction being parallel to the first main surface 110, the drift zone 260 comprising a superjunction layer stack 300, the superjunction layer stack 300 comprising n-doped and p-doped layers being stacked in a stack direction in an alternating manner. The stack direction is perpendicular with respect to the first main surface 110. At least one of the source region 201 and the drain region 205 extends to a depth so that a bottom boundary between the source region 201 or the drain region 205 and the substrate 100 is disposed beneath a bottom interface between the n-doped and p-doped layers of the layer stack.

In the context of the present specification, the term "bottom boundary between the source region 201 (or the drain region 205) and the "substrate" refers to the boundary having the greatest distance to the first main surface 110 of the substrate 100. For example, this boundary may be a horizontal boundary that is buried within the substrate 100. The term "bottom interface between the n-doped and p-doped layers of the layer stack" as used within this specification relates to the interface between the n-doped and p-doped layers of the layer stack having a greater distance than any of the other interfaces within the layer stack. Generally speaking, the definition that at least one of the source region 201 and the drain region 205 extends to a depth so that a bottom boundary between the source region 201 or the drain region 205 and the substrate 100 is disposed beneath a bottom interface between the n-doped and p-doped layers of the layer stack comprises an embodiment, according to which at least one of the source region 201 and the drain region 205 extends to a depth to which also the superjunction layer stack 300 extends.

In the following, a method of manufacturing the semiconductor device shown in FIG. 1 will be illustrated. A semiconductor substrate 100 is pre-processed by performing implantation steps which are generally known. For example, a well implantation step may be performed so as to form n- or p-doped well portions 120 and a deep body connect implantation region 225.

A multi-layer epitaxial process is performed so as to form a superjunction layer stack 300 comprising a plurality of p- and n-doped sublayers 310, 320. For example, such a layer stack may be formed by an epitaxial process for silicon, in which n-type dopants and p-type dopants are alternatingly and successively fed so as to form a sequence of differently doped layers. According to an embodiment, this may be accomplished using one single epitaxy chamber, in which the differently doped layers are formed without vacuum break.

FIG. 2A shows an example of a resulting structure. As is shown, the substrate portion comprises an n-doped substrate portion 130, a p-doped well portion 120, a p+-doped body connect implantation region 225 and the superjunction layer stack 300. As is to be clearly understood, the definitions of the specific layers to be n-doped and p-doped is only by way of example. Of course, these conductivity types may be interchanged. For example, the layer stack 300 may have a height of at least 1 μm, for example, more than about 1.5 μm. The thickness of the individual sublayers 310, 320 may be about 50 nm to 2 μm, for example, 100 nm to 1 μm.

Thereafter, a channel region trench 312 is formed in the surface of the structure shown in FIG. 2A. The channel region trench 312 may be formed so as to extend perpendicularly with respect to the depicted plane of the drawing. The channel region trench 312 may be formed by, first forming a hard mask layer (stack). Then, the channel region trench 312 is defined photolithographically in the hard mask layer (stack) 330. Thereafter, etching is performed so as to etch the channel region trench 312.

Figure 2B:
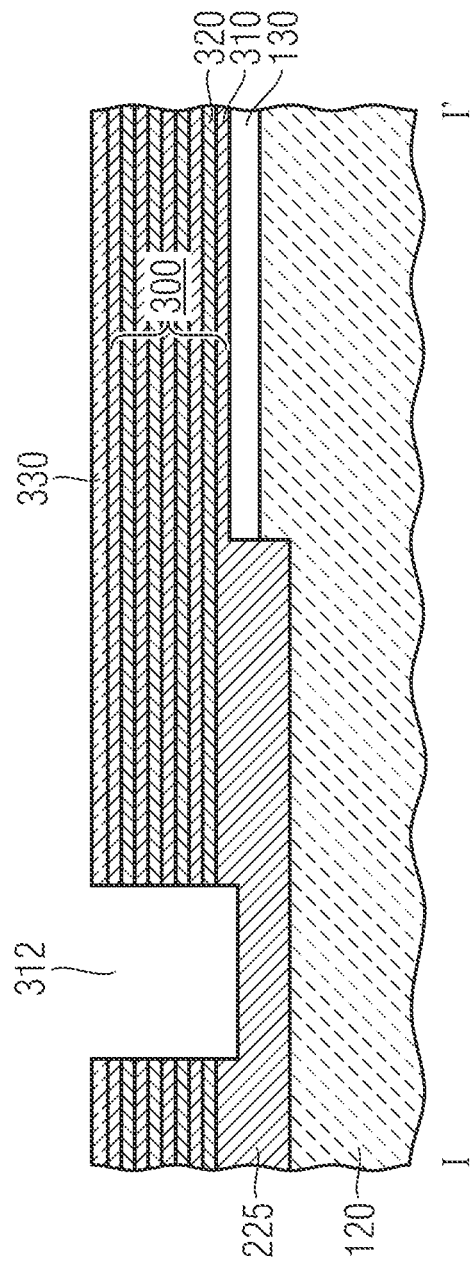

FIG. 2B shows an example of a resulting structure. The channel region trench 312 extends to the deep body connect implantation region 225. Thereafter, the material 340 for forming the channel region 220 is filled in the channel region trench 312. For example, this may be accomplished by a selective epitaxial method for growing either doped semiconductor material or undoped semiconductor material. If the grown material is undoped epitaxial material, channel doping by implantation may be performed so as to provide an n- or p-doped semiconductor material. Alternatively, a selective epitaxial method for growing p-doped semiconductor material may be performed. Optionally, a CMP step may be performed so as to remove projecting semiconductor portions.

FIG. 2C shows an example of the resulting structure. As is shown, the channel region trench 312 now is filled with an epitaxial layer 340. Thereafter, gate trenches 212 are formed to separate the epitaxial layer 340 into single channel regions 220. For example, the gate trenches 212 may be photolithographically defined and etched, optionally, using a hardmask layer 330 as is conventional. For example, the gate trenches 212 may have a depth of approximately 200 to 5000 nm. A distance between adjacent gate trenches 212 may be 30 to 300 nm. The gate trenches 212 are formed to extend in the first direction.

FIG. 2D illustrates a cross-sectional view that is taken between IV-IV' as illustrated in FIG. 1B, for example and also shown in FIG. 2E. As is shown, the gate trenches 212 pattern the epitaxial layer 340 so that a resulting channel regions 220 have the shape of a ridge as is also shown in FIG. 1C, for example. Then, the residues of the hard mask layer are removed. Thereafter, in case a field plate is to be formed, a field oxide layer 251 may be deposited, for example, by low pressure chemical vapor deposition (LPCVD). Alternatively, a plasma enhanced chemical vapor deposition (PECVD) method may be used for forming the field oxide layer 251. The field oxide may be lithographically patterned, and etched. In the next step, a thermal oxidation process may be performed so as to form the gate dielectric layer 211. For example, the gate dielectric layer, which may be, for example, silicon oxide, may have a thickness of 5 to 200 nm. Thereafter, a conductive material is deposited so as to form the gate electrode 210 and, optionally, the field plate 250. The conductive layer may have a thickness of more than 10 nm and up to 2 μm. For example, doped polysilicon material may form the gate electrode 210 and the field plate. Accordingly, for example, doped polysilicon may be deposited or undoped polysilicon may be deposited, followed by an implantation step. For example, the polysilicon may be doped with n-type dopants. Thereafter, the conductive material is etched so as to pattern the gate electrode 210 and, optionally, the field plate 250. As has been discussed above, instead of a field plate 250 and the corresponding field oxide layer 251, a terminal sub-layer may disposed at the top of the superjunction layer stack 300. In this case, the terminal sub-layer is already formed in the processing step that has been explained with reference to FIG. 2A.

FIG. 2F shows a cross-sectional view of the resulting structure. FIG. 2G shows a schematic plan view of the resulting structure showing that the gate electrode 210 is disposed so as to intersect the channel region 220. As is shown, the gate electrode 210 is formed in the gate trenches 212 so as to be adjacent to the channel region 220, being insulated by a gate dielectric layer 211.

Thereafter, contact trenches are defined so as provide connections to the source and drain regions 201, 205. For example, the contact trenches may be photolithographically defined and etched, optionally using a hard mask layer. Then, a tilted implantation step, for example, with n-type dopants, may be performed so as to form the source region 201 and the drain region 205. For example, the source region 201 and the drain region 205 may extend to different depths. For example, the source region 201 and the drain region 205 may extend to a depth of approximately 500 to 5000 nm. For example, any of the source region 201 and the drain region 205 may extend to approximately the same depth or less than the depth of the gate trenches 212. The term "approximately the same depth" is intended to mean that due to process induced variations, the depth of any of the source region 201 and the drain region 205 may be about 10% less than the depth of the gate trenches 212. Optionally, a further $p^+$ implantation step may be performed to further dope the portions that are directly disposed beneath the channel region 220, to form the $p^+$-doped body connect implantation portion 225. This further $p^+$ implantation step may be performed before or after defining the source and drain regions 201, 205. Then, conductive material for forming the source electrode 202 and the drain electrode 206 is filled in the contact trenches. For example, the conductive material may comprise doped polysilicon or a layer stack comprising Ti, TiN and tungsten (W). The conductive material may be etched back. Contacts may be formed and the further processing steps which are common for transistor manufacturing may be performed.

According to another embodiment, the tilted implantation step and the contact trench processing can be performed at a later processing stage, for example during the so-called MOL (mid-of-line) processing steps.

According to further embodiments, the contact trenches may be etched to a deeper depth than illustrated in FIG. 2H so as to provide a contact to the second main surface 115 of the semiconductor device.

FIG. 2H shows a cross-sectional view of an example of a resulting structure, perpendicular with respect to the first main surface 110 of the substrate 100, and FIG. 2J shows a cross-sectional parallel with respect to the first main surface 110 of the substrate 100.

FIG. 3 illustrates a method of manufacturing a semiconductor device. As is shown, the method of manufacturing a semiconductor device may comprise forming a transistor in a semiconductor substrate comprising a first main surface, wherein forming the transistor comprises forming a source region (S40), a drain region (S40), a channel region (S10), a drift zone (S20), and a gate electrode (S30) adjacent to the channel region, wherein the channel region and the drift zone are formed to be disposed along a first direction between the source region and the drain region, the first direction being parallel to the first main surface, wherein forming the channel region (S10) comprises forming (S15) a ridge extending along the first direction, and forming the drift zone (S20) comprises forming (S25) a superjunction layer stack.

According to an embodiment, forming the superjunction layer stack comprises epitaxially growing a sequence of differently doped layers. Nevertheless, as is clearly to be understood, forming the superjunction layer stack may as well comprise performing ion implantation so as to form the differently doped layers.

According to an embodiment growing the sequence of differently doped layers may be accomplished by sequentially interchanging the source of the dopants during the growth process. According to further embodiments, the sequence of differently doped layers may be formed by different methods, for example comprising etching trenches and epitaxially forming reversely doped semiconductor material to fill the trenches as is conventional.

FIGS. 4A and 4B illustrate further embodiments, according to which the semiconductor device may further comprise contacts to a second main surface 115 which is opposite to the first main surface 110 of the semiconductor substrate 100. According to the embodiment shown in FIG. 4A, the source electrode (source contact) 202 that is electrically coupled to the source region 201, may extend to the first main surface 110 and the drain electrode (drain contact) 206 that is electrically coupled to the drain region 205, may extend to the second main surface 115 being opposite to the first main surface 110. The drain electrode 206 may be insulated from adjacent substrate material by means of an insulating material 207. Further, the drain region 205 may be insulated at the first main surface 110 by means of an insulating layer 208.

According to the embodiment shown in FIG. 4B, the source electrode 202 that is electrically coupled to the source region 201, may extend to the second main surface 115 and the drain electrode 206 that is electrically coupled to the drain region 205, may extend to first main surface 110. The source electrode 202 may be insulated from adjacent substrate material by means of an insulating material 204. Further, the source region 201 may be insulated at the first main surface 110 by means of an insulating layer 203.

According to these embodiments, for example, the contact to the drain region 205 (or the source region 201) may be led to the second main surface 115, while the drain region 205 (or the source region 201) is insulated at the first main surface 110. As a consequence, a quasi-vertical device may be implemented. As is to be clearly understood, according to a further embodiment, contacts to the source and drain regions 201, 205 may be led to the second main surface 115.

As has been illustrated in the foregoing, embodiments of the present specification relate to a semiconductor device which is implemented as a so-called lateral device enabling a current flow approximately parallel to the first main surface 110 of the semiconductor substrate 100. Accordingly, for example, source and drain regions 201, 205 may be formed in an easy manner and all device components may be processed adjacent to the first main surface 110 of the substrate 100. The channel region 220 has the shape of a ridge, thus implementing a three-dimensional structure. The gate electrode 210 is disposed in gate trenches 212 extending along the whole depth of the channel region 220. Accordingly, control of a conductive channel formed in the channel region 220 may be accomplished over the whole depth of the transistor 200. According to an embodiment in which the channel region 220 has the shape of a ridge having a special width, the transistor 200 may be fully depleted when a gate voltage corresponding to an on-state is applied. Thereby, a transistor 200 having improved sub-threshold slope characteristics is implemented. Further, the effective transistor width is increased, so that the effective area of the transistor is increased without increasing the space that is required.

The drift zone 260 comprises a superjunction layer stack 300. Accordingly, in case of an off-voltage, the charge compensation between carriers in the drift zone 260 may be effectively carried out. According to an embodiment the superjunction layer stack 300 may be formed by stacking n and p doped layers in a stack direction that may be perpendicular with respect to the first main surface 110 of the semiconductor substrate 100. According to this embodiment, it is possible to generate differently doped layers by simply interchanging the dopant that is fed during epitaxy. As a consequence, even process-induced fluctuations of the layer thickness may result in a layer stack in which the layer thicknesses of the differently doped layers may be identical. Further, according to embodiments, it is not essential that the differently doped layers have an identical thickness. As an example, the amount of dopants or charges within the single layers should be approximately identical. According to embodiments, a minimum layer thickness of 50, 70 or 100 nm may employed so that the device may also be used for applications requiring low reverse voltages.

While embodiments of the invention have been described above, further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising a transistor formed in a semiconductor substrate having a first main surface, the transistor comprising:
    a source region;
    a drain region;
    a channel region;
    a drift zone; and
    a gate electrode at the channel region, the gate electrode configured to control a conductivity of a channel formed in the channel region,
    the channel region and the drift zone disposed along a first direction between the source region and the drain region, the first direction being parallel to the first main surface, the channel region patterned into a ridge extending along the first direction between sub-divisions of the gate electrode by adjacent first trenches extending in the first direction in the semiconductor substrate, and
    the drift zone comprising a superjunction layer stack.

2. The semiconductor device according to claim 1, wherein the gate electrode is disposed at least two sides of the ridge.

3. The semiconductor device according to claim 1, wherein the ridge comprises a top side and two sidewalls, the sidewalls extending along the first direction.

4. The semiconductor device according to claim 3, wherein a conductive inversion layer is formed along at least one of the sidewalls when the device is operated in an on-state.

5. The semiconductor device according to claim 1, further comprising a field plate that is disposed adjacent to the superjunction layer stack.

6. The semiconductor device according to claim 1, wherein a width of the ridge of the channel region fulfills the following relationship: $d1 \leq 2 \times l_d$, wherein $l_d$ denotes a length of a depletion zone formed at an interface between the channel region and a gate dielectric, the gate dielectric being disposed between the channel region and the gate electrode.

7. The semiconductor device according to claim 1, wherein the superjunction layer stack comprises n-doped and p-doped layers being stacked in a stack direction in an alternating manner, the stack direction being perpendicular with respect to the first main surface.

8. The semiconductor device according to claim 1, wherein the superjunction layer stack comprises n-doped layers and p-doped layers being arranged in a stack direction in an alternating manner, the stack direction extending in a direction parallel to the first main surface and perpendicular with respect to a depth direction.

9. The semiconductor device according to claim 1, wherein the length s1 of the ridge measured along the first direction and a width d1 of the ridge measured perpendicularly with respect to the first direction fulfills the following relationship $s1/d1>2.0$.

10. The semiconductor device according to claim 1, wherein the source and the drain region are disposed within the semiconductor substrate and extend approximately to a depth to which the gate electrode extends from the first main surface in a depth direction of the semiconductor substrate.

11. The semiconductor device according to claim 1, wherein at least one of the source region and the drain region extends to a depth which is more than 1 μm.

12. The semiconductor device according to claim 1, wherein the superjunction layer stack comprises at least two n-doped or at least two p-doped layers.

13. The semiconductor device according to claim 1, further comprising:
    a source contact, coupled to the source region; and
    a drain contact, coupled to the drain region,
    wherein the source contact extends to the first main surface and the drain contact extends to a second main surface that is opposite to the first main surface, and wherein the drain region is insulated at a region of the first main surface.

14. The semiconductor device according to claim 1, further comprising:
    a source contact, coupled to the source region; and
    a drain contact, coupled to the drain region,
    wherein the drain contact extends to the first main surface and the source contact extends to a second main surface that is opposite to the first main surface, and wherein the source region is insulated at a region of the first main surface.

15. A method of manufacturing a semiconductor device comprising forming a transistor in a semiconductor substrate having a first main surface, wherein forming the transistor comprises:
    forming a source region, a drain region, a channel region, a drift zone, and a gate electrode adjacent to the channel region, wherein the channel region and the drift zone are formed to be disposed along a first direction between the source region and the drain region, the first direction being parallel to the first main surface, wherein forming the channel region comprises forming a ridge extending along the first direction between sub-divisions of the gate electrode by forming adjacent first trenches extending in the first direction in the semiconductor substrate, and forming the drift zone comprises forming a superjunction layer stack.

16. The method of claim 15, wherein forming the superjunction layer stack comprises epitaxially growing a sequence of differently doped layers.

17. The method of claim 16, wherein growing the sequence of differently doped layers is accomplished by sequentially interchanging the source of dopants fed during a growth process of growing the differently doped layers.

18. The method of claim 15, wherein forming the channel region is performed after forming the superjunction layer stack, and wherein forming the channel region comprises an epitaxial growth process.

19. The method of claim 15, wherein forming the ridge and forming the gate electrode is accomplished by a method comprising forming gate trenches in the channel region and forming a conductive layer so as to fill adjacent trenches, the gate trenches extending in the first direction.

20. A semiconductor device comprising a transistor formed in a semiconductor substrate having a first main surface, the transistor comprising:
    a source region;
    a drain region;
    a channel region;
    a drift zone; and a gate electrode at the channel region, the gate electrode configured to control a conductivity of a channel formed in the channel region, the gate electrode being insulated from the channel region by a gate dielectric, the channel region and the drift zone disposed along a first direction between the source region and the drain region, the first direction being parallel to the first main surface, the drift zone comprising a superjunction layer stack, the superjunction layer stack comprising n-doped and p-doped layers stacked in a stack direction in an alternating manner, the stack direction being perpendicular with respect to the first main surface, the channel region extending between sub-divisions of the gate electrode, and at least one of the source region and the drain region extending to a depth so that a bottom boundary between the source region or the drain region and the semiconductor substrate is disposed beneath a bottom interface between the n-doped and p-doped layers of the layer stack.

* * * * *